(12) United States Patent
Won et al.

(10) Patent No.: US 11,984,156 B2
(45) Date of Patent: May 14, 2024

(54) NONVOLATILE MEMORY DEVICES HAVING PUMPING CIRCUITS OPERABLE IN MULTIPLE MODES

(71) Applicant: Samsung Electronics Co., Ltd., Suwon-si (KR)

(72) Inventors: Sang Gyeong Won, Suwon-si (KR); Gyu Seong Kim, Hwaseong-si (KR); Hyun-Jin Shin, Hwaseong-si (KR)

(73) Assignee: Samsng Electronics Co., Ltd. (KR)

( * ) Notice: Subject to any disclaimer, the term of this patent is extended or adjusted under 35 U.S.C. 154(b) by 164 days.

(21) Appl. No.: 17/679,530

(22) Filed: Feb. 24, 2022

(65) Prior Publication Data
US 2022/0359004 A1 Nov. 10, 2022

(30) Foreign Application Priority Data

May 7, 2021 (KR) ........................ 10-2021-0058928

(51) Int. Cl.
*G11C 11/4074* (2006.01)
*G11C 11/56* (2006.01)

(52) U.S. Cl.
CPC ...... *G11C 11/5635* (2013.01); *G11C 11/4074* (2013.01); *G11C 11/5642* (2013.01)

(58) Field of Classification Search
CPC ............ G11C 11/5635; G11C 11/4074; G11C 11/5642; G11C 5/145; G11C 16/0483; G11C 16/10; G11C 16/16; G11C 16/26; G11C 16/30; G11C 8/08; G11C 16/08
See application file for complete search history.

(56) References Cited

U.S. PATENT DOCUMENTS

| | | | | |
|---|---|---|---|---|
| 5,732,039 A * | 3/1998 | Javanifard | ............. | H02M 3/07 327/535 |
| 6,229,385 B1 * | 5/2001 | Bell | ................ | G01R 31/31701 327/536 |
| 6,724,242 B2 * | 4/2004 | Kim | ...................... | H02M 3/073 327/536 |
| 6,980,045 B1 * | 12/2005 | Liu | ....................... | H02M 3/073 363/59 |
| 7,414,890 B2 * | 8/2008 | Byeon | .................... | G11C 16/30 327/536 |
| 7,741,898 B2 | 6/2010 | Hsu | | |
| 7,843,712 B2 | 11/2010 | Lee | | |
| 8,487,690 B2 | 7/2013 | Wei et al. | | |
| 9,007,046 B2 | 4/2015 | Pan | | |
| 10,049,714 B1 * | 8/2018 | Lee | ........................ | G01R 31/36 |
| 10,148,171 B2 | 12/2018 | Nguyen et al. | | |

(Continued)

*Primary Examiner* — Khamdan N. Alrobaie
(74) *Attorney, Agent, or Firm* — Myers Bigel, P.A.

(57) ABSTRACT

A non-volatile memory device is provided. The non-volatile memory device may include a memory cell array, a first pumping circuit configured to output a first pumping voltage, a second pumping circuit configured to pump the first pumping voltage of the first pumping circuit to output a second pumping voltage, and a pumping circuit control unit which is connected to the first pumping circuit and the second pumping circuit and configured to output at least one of the first pumping voltage and the second pumping voltage to the memory cell array. The first pumping circuit may be enabled in a first mode and a second mode different from the first mode, and the second pumping circuit may be disabled or not enabled in the first mode and enabled in the second mode.

19 Claims, 18 Drawing Sheets

(56) References Cited

U.S. PATENT DOCUMENTS

| | | | |
|---|---|---|---|
| 10,707,749 B2 | 7/2020 | Shin | |
| 10,847,227 B2 | 11/2020 | Tran et al. | |
| 2003/0201673 A1* | 10/2003 | Sim ................... | G11C 11/4074 307/80 |
| 2004/0095806 A1* | 5/2004 | Osawa ................. | G11C 5/145 365/185.18 |
| 2007/0008681 A1* | 1/2007 | Park .................... | G11C 5/14 361/600 |
| 2008/0079503 A1* | 4/2008 | Byeon ................. | G11C 16/30 331/16 |
| 2009/0003049 A1* | 1/2009 | Lee ..................... | G11C 11/5678 365/163 |
| 2010/0019810 A1* | 1/2010 | Kim .................... | G11C 5/145 327/142 |
| 2013/0285718 A1* | 10/2013 | Kim .................... | H02M 3/07 327/144 |
| 2019/0272864 A1* | 9/2019 | Hsu .................... | G11C 29/56 |
| 2021/0005265 A1* | 1/2021 | Lee .................... | G11C 16/08 |

* cited by examiner

NONVOLATILE MEMORY DEVICES HAVING PUMPING CIRCUITS OPERABLE IN MULTIPLE MODES

CROSS-REFERENCE TO RELATED APPLICATION

This application claims priority and all benefits accruing under 35 U.S.C. § 119 to Korean Patent Application No. 10-2021-0058928, filed on May 7, 2021, in the Korean Intellectual Property Office, and the entire contents of the above-identified application are herein incorporated by reference.

TECHNICAL FIELD

The present disclosure relates to non-volatile memory devices.

BACKGROUND

Non-volatile memory devices may perform read, program (or write), and erase operations on the basis of commands. The non-volatile memory devices may require different levels of voltage depending on the type of operations. For example, a relatively higher voltage may be required to perform program and erase operations, and a relatively low voltage may be required to perform a read operation. The non-volatile memory device may generate various levels of voltage through a charge pump circuit.

SUMMARY

Aspects of the present disclosure may provide a non-volatile memory device in which a product size may be reduced and an operating efficiency may be improved.

According to some aspects of the present inventive concepts, there is provided a non-volatile memory device comprising a memory cell array, a first pumping circuit configured to output a first pumping voltage, a second pumping circuit configured to pump the first pumping voltage of the first pumping circuit to output a second pumping voltage and a pumping circuit control unit which is connected to the first pumping circuit and the second pumping circuit and configured to cause at least one of the first pumping voltage and the second pumping voltage to be output to the memory cell array, wherein the first pumping circuit is enabled in a first mode and a second mode different from the first mode, and the second pumping circuit is not enabled in the first mode and enabled in the second mode.

According to some aspects of the present inventive concepts, there is provided a non-volatile memory device comprising a memory cell array, a voltage generating circuit configured to provide a voltage to the memory cell array and a control logic configured to control the voltage generating circuit, wherein the voltage generating circuit includes a pumping circuit which includes a plurality of pumping units connected in series with each other, and a pumping circuit control unit configured to receive an output of the plurality of pumping units and outputs the output to the memory cell array. The pumping circuit control unit may be configured to output a first pumping voltage generated from the plurality of pumping units to the memory cell array, in response to the control logic receiving a first command. The pumping circuit control unit may be configured to output a second pumping voltage higher than the first pumping voltage generated from the plurality of pumping units to the memory cell array, in response to the control logic receiving a second command different from the first command. The pumping circuit control unit may be configured to output the first pumping voltage and the second pumping voltage to the memory cell array, in response to the control logic receiving a third command different from the first and second commands.

According to some aspects of the present inventive concepts, there is provided a non-volatile memory device comprising a memory cell array, a first pumping circuit that is configured to output the first pumping voltage, a second pumping circuit that is configured to pump the first pumping voltage of the first pumping circuit to output a second pumping voltage, a first drive unit that is configured to provide a first clock pulse to only the first pumping circuit and not to the second pumping circuit, a second drive unit that is configured to provide the first and second pumping circuits with a second clock pulse having a higher voltage level than the first clock pulse and a pumping circuit control unit which is connected to the first pumping circuit and the second pumping circuit and configured to output at least one of the first pumping voltage and the second pumping voltage to the memory cell array.

However, aspects of the present inventive concepts are not restricted to the those set forth herein. The above and other aspects of the present inventive concepts will become more apparent to those of ordinary skill in the art to which the present disclosure pertains by referencing the detailed description of the present inventive concepts given below.

DETAILED DESCRIPTION OF THE EMBODIMENTS

Hereinafter, some embodiments incorporating one or more of the inventive concepts of the present disclosure will be described with reference to the accompanying drawings.

Figure 1:
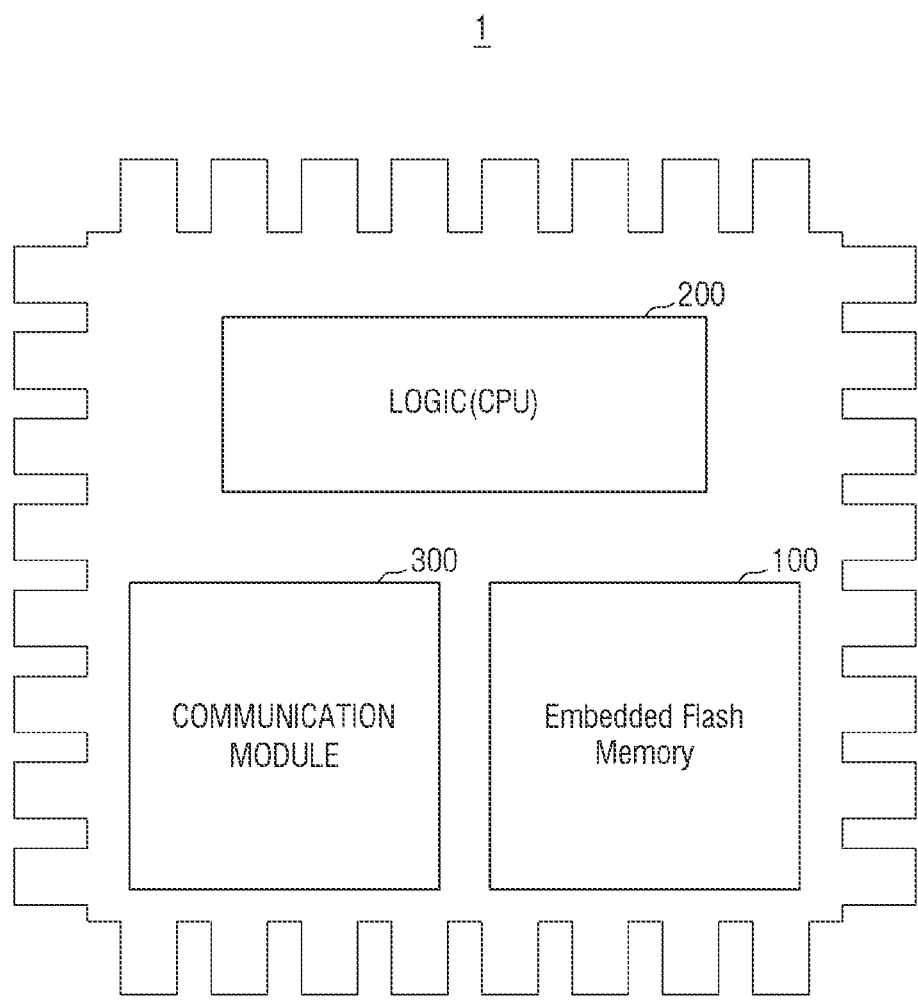
FIG. 1 is a diagram showing a memory chip according to some embodiments.

FIG. 1 is a diagram showing a memory chip according to some embodiments.

Referring to FIG. 1, a memory chip 1 may include a non-volatile memory device 100, a processor 200 and a communication module 300. The memory chip 1 may constitute, but is not limited to, a computer, a UMPC (Ultra Mobile PC), a workstation, a digital picture player, a digital video recorder, a digital video player, a storage forming a data center, a device that may transmit and receive information in a wireless environment, one of various electronic devices that make up a home network, one of various electronic devices that make up a computer network, one of various electronic devices that make up a telematics network, one of various components that make up a computing system, or the like.

The non-volatile memory device 100 may operate under the control of the processor 200. For example, the non-volatile memory device 100 may program or write data in response to a provided program command CMD. In another example, the non-volatile memory device 100 may read previously programmed data in accordance with a provided read command CMD, and may transmit the read data to the processor 200. The non-volatile memory device 100 may include a flash memory of a 2D (2-dimensional) structure or a 3D (3-dimensional) V-NAND (Vertical NAND) structure. Also, the non-volatile memory device 100 may also include other types of non-volatile memory such as a PRAM and/or a RRAM. The non-volatile memory device 100 will be described in detail below referring to FIG. 2.

The processor 200 may control the overall operations of the memory system. Specifically, the processor 200 may control the operation of other components constituting the memory chip 1. Further, the processor 200 may perform control and arithmetic functions of the non-volatile memory device 100. The processor 200 may transmit the command CMD to the non-volatile memory device 100 to program, read or erase the data. Such a processor 200 may be implemented as a general-purpose processor, a dedicated processor, an application processor, or the like.

The communication module 300 may control wired/wireless communication with devices and/or components external to the memory chip 1.

In FIG. 1, although the memory chip 1 is shown as an embedded memory system in which the processor 200 and the non-volatile memory device 100 are included in a single chip, the present disclosure is not limited thereto. For example, in some embodiments, the memory chip 1 may include the non-volatile memory device 100 and the processor 200 as separate semiconductor chips.

Figure 2:
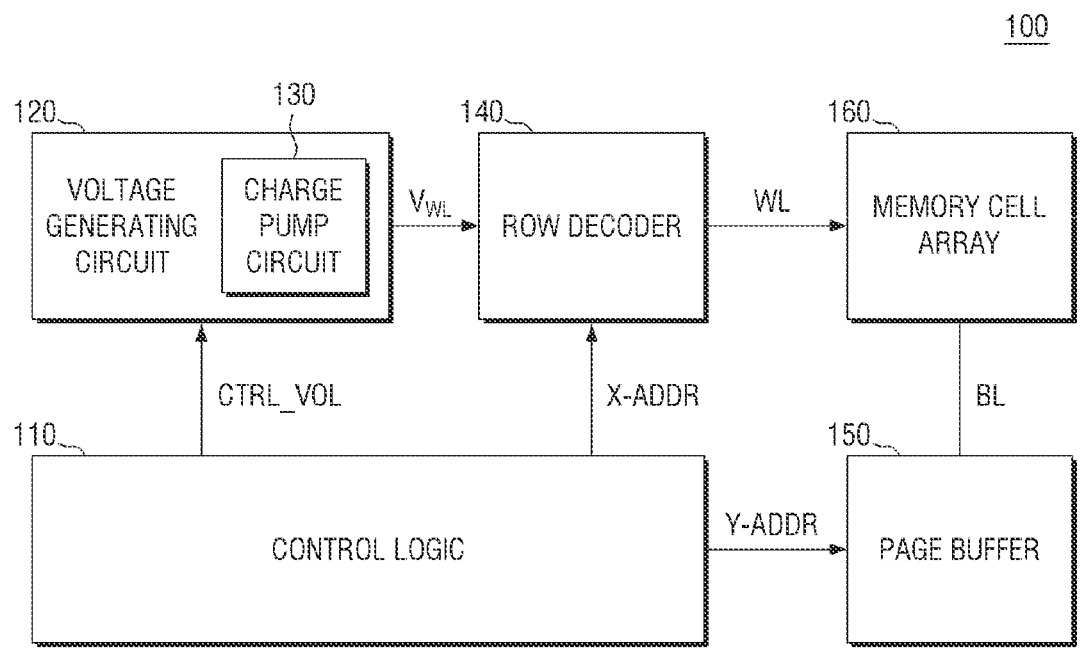
FIG. 2 is a diagram showing a non-volatile memory device according to some embodiments.

FIG. 2 is a diagram showing a non-volatile memory device according to some embodiments.

Referring to FIG. 2, the non-volatile memory device 100 may include a control logic 110, a voltage generating circuit 120, a charge pump circuit 130, a row decoder 140, a page buffer 150, and a memory cell array 160.

The control logic 110 may control the overall operation of the non-volatile memory device 100. The control logic 110 may respond to a command CMD from the processor 200, and may output various control signals for, e.g., writing data to the memory cell array 160, erasing data from the memory cell array 160, or reading data from the memory cell array 160. For example, the control logic 110 may transmit a voltage control signal CTRL_VOL to the voltage generating circuit 120 on the basis of the command CMD, may output a row address X-ADDR to the row decoder 140 on the basis of the address ADDR, and may output a column address Y-ADDR to the page buffer 150.

The voltage generating circuit 120 may generate the voltage needed for operation according to the voltage control signal CTRL_VOL from the control logic 110. The voltage control signal CTRL_VOL may include a read voltage generating signal, a program voltage generating signal or an erase voltage generating signal. For example, the voltage generating circuit 120 may generate a program voltage, when receiving a program voltage generating signal from the control logic 110. Further, the voltage generating circuit 120 may generate a read voltage, when receiving a read voltage generating signal from the control logic 110. The voltage generating circuit 120 may generate an erase voltage when receiving an erase voltage generating signal from the control logic 110.

The charge pump circuit 130 may generate a voltage applied to a word line WL, and may pump an input voltage to output a voltage of a level higher than the input voltage. The charge pump circuit 130 may generate voltage of various levels.

The row decoder 140 may select one of multiple word lines WL in response to the row address X-ADDR. The row decoder 140 may supply the selected word lines and the non-selected word lines with a word line voltage according to each operating mode. For example, at the time of the program operation, the row decoder 140 may apply a program voltage to the selected word line, and may supply a pass voltage to the non-selected word line. Further, the row decoder 140 may supply a ground voltage to the selected word line and apply a read voltage to the non-selected word line at the time of the read operation.

The page buffer 150 may be connected to each of the memory cells through a plurality of bit lines BL. The page buffer 150 may select at least one bit line among the bit lines BL in response to the column address Y-ADDR. The page buffer 150 may act as a write driver or a detection amplifier, depending on the operating mode. For example, at the time of the program operation, the page buffer 150 may apply a bit line voltage corresponding to the data to be programmed to the selected bit line. Further, at the time of the read operation, the page buffer 150 may detect the current or voltage of the selected bit line to detect the data stored in the memory cell.

The memory cell array 160 may be made up of a plurality of memory blocks, and each of the plurality of memory blocks may include a plurality of memory cells. Each memory cell may be a cell single level cell (SLC) that stores 1-bit information, and may be a cell that stores 2-bits or more information such as a MLC (multi level cell), a TLC (triple level cell), or a QLC (quadruple level cell). The memory blocks may be stacked in a three-dimensional form, without being limited to a two-dimensional form. Each block of the memory cell array 160 may include a plurality of word lines WL and a plurality of bit lines BL. The memory blocks of the memory cell array 160 will be described in detail below referring to FIG. 3.

Figure 3:
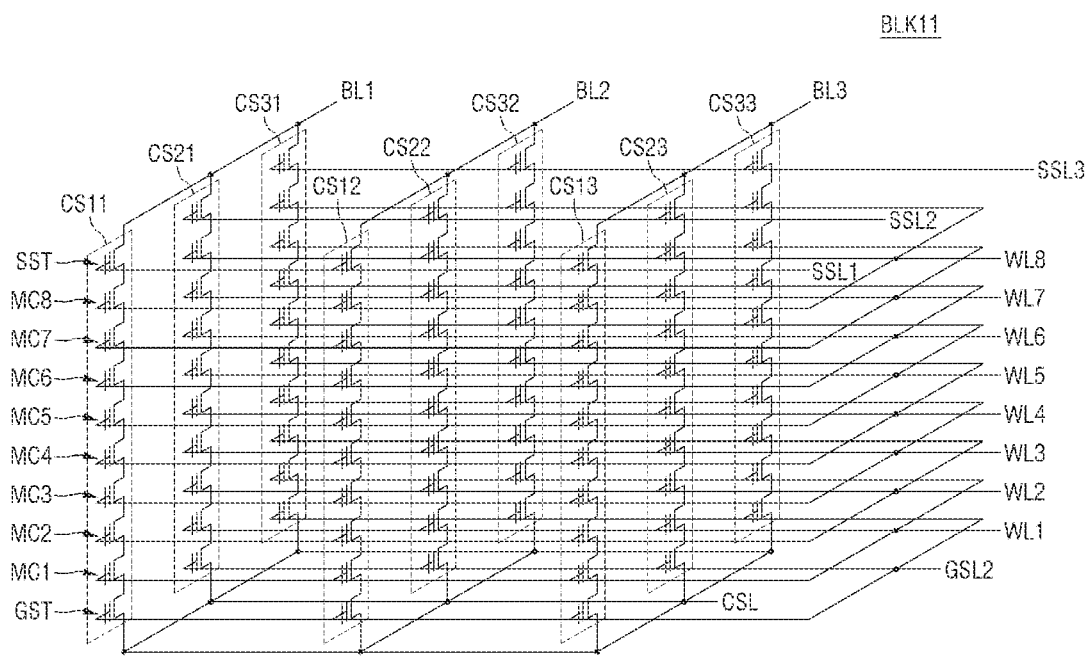
FIG. 3 is an equivalent circuit diagram showing a memory block according to some embodiments.

FIG. 3 is an equivalent circuit diagram showing a memory block according to some embodiments.

Referring to FIG. 3, the memory block BLK11 shows a three-dimensional memory block formed in a three-dimensional structure on the substrate. For example, a plurality of cell strings included in the memory block BLK11 may be formed in a direction perpendicular to the substrate.

The memory block BLK11 may include a plurality of cell strings CS11 to CS33 connected between the bit lines BL1, BL2 and BL3 and a common source line CSL. Each of the plurality of cell strings CS11 to CS33 may include a string selection transistor SST, a plurality of memory cells MC1 to MC8, and a ground selection transistor GST.

A plurality of memory cells MC1 to MC8 may each be connected to corresponding word lines WL1 to WL8. The word lines WL1 to WL8 may receive the voltage corresponding to the operation from the row decoder 140. The ground selection transistor GST may be connected to the ground selection line GSL2. The string selection transistor SST may be connected to the corresponding bit lines BL1, BL2 and BL3, and the ground selection transistor GST may be connected to the common source line CSL.

Word lines (e.g., WL1) of the same height are commonly connected, and the string selection lines SSL1, SSL2 and SSL3 may be separated from each other.

Although FIG. 3 shows that the memory block BLK11 is connected to eight word lines WL1, WL2, WL8 and three bit lines BL1, BL2 and BL3, the present disclosure is not limited thereto. Further, although FIG. 3 shows a 3D V-NAND (Vertical NAND) structure, the present disclosure is not limited thereto. In some embodiments, the memory cell array 160 included in the non-volatile memory device 100 may have a NOR flash structure.

Figure 4:
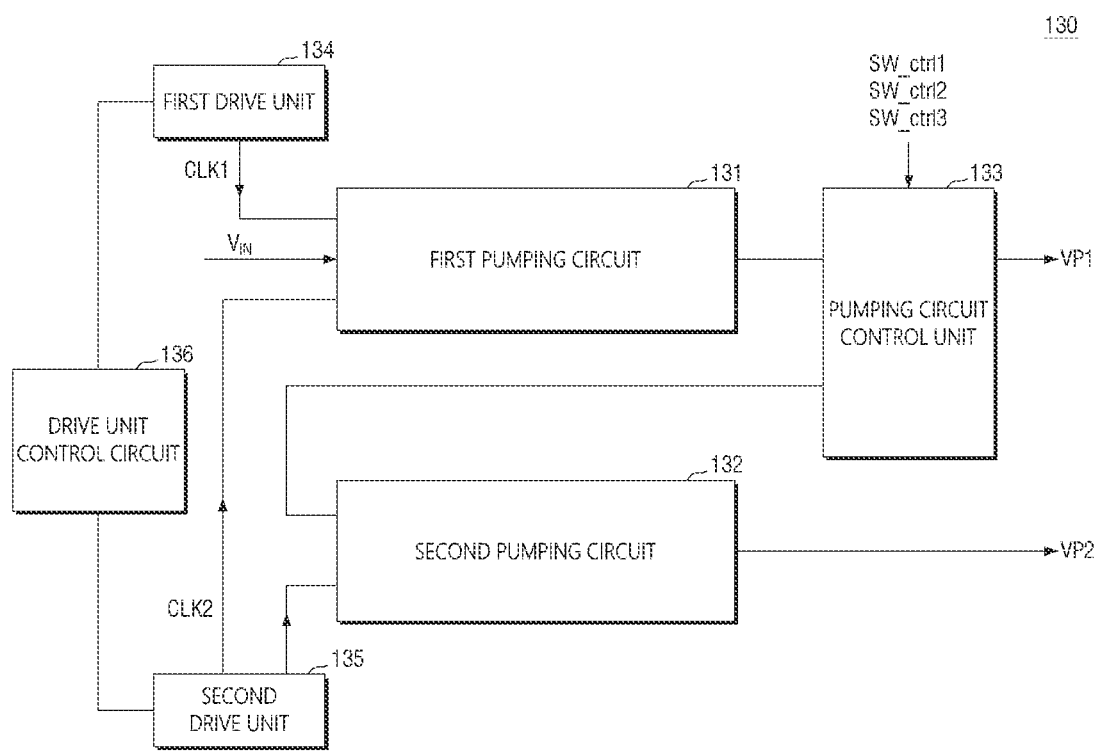
FIGS. 4 and 5 are diagrams showing a charge pump circuit according to some embodiments.
Figure 5:
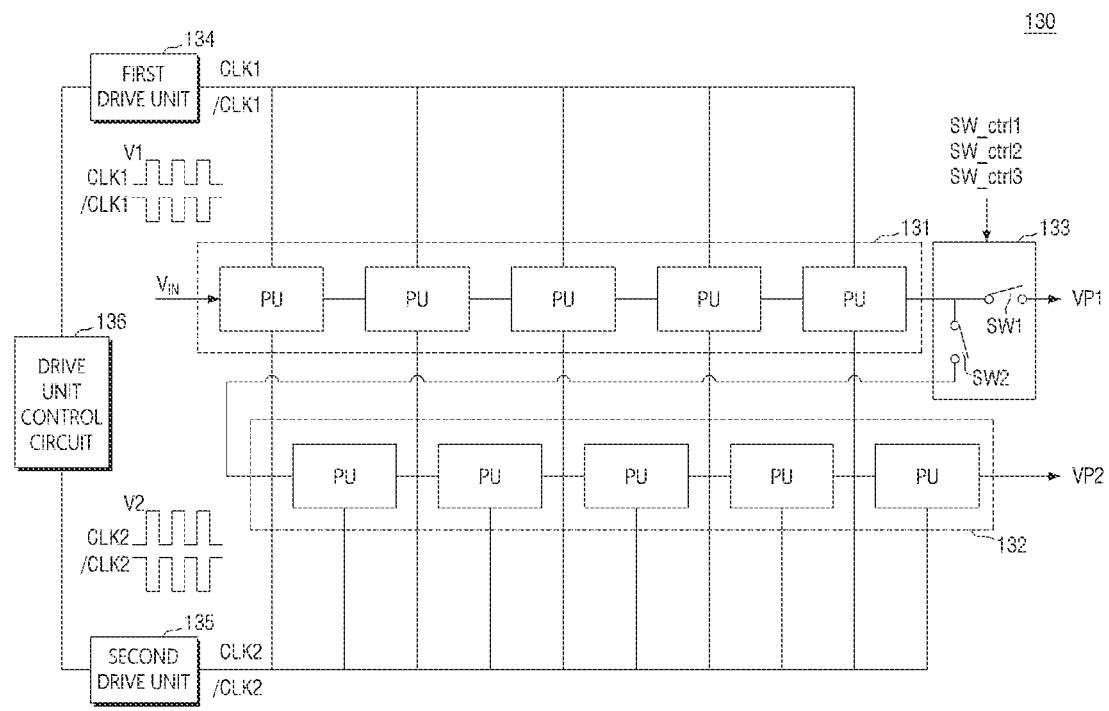

FIGS. 4 and 5 are diagrams showing a charge pump circuit according to some embodiments.

Referring to FIG. 4, the charge pump circuit 130 may include a first pumping circuit 131, a second pumping circuit 132, a pumping circuit control unit 133, a first drive unit 134, and a second drive unit 135, and a drive unit control circuit 136.

In some embodiments, the first pumping circuit 131 may pump an input voltage $V_{IN}$ by the first drive unit 134 and may output a first pumping voltage VP1. Further, in some embodiments the first pumping circuit 131 may pump the input voltage $V_{In}$ by the second drive unit 135 and output the first pumping voltage VP1 to the second pumping circuit 132.

In some embodiments, the second pumping circuit 132 may pump the first pumping voltage VP1 received from the first pumping circuit 131 by the second drive unit 135 and output a second pumping voltage VP2.

The pumping circuit control unit 133 receives switching signals SW_ctr11, SW_ctr12 and SW_ctr13 from the control logic 110, and may control whether to output the first pumping voltage VP1 and the second pumping voltage VP2.

The first drive unit 134 may provide the first clock pulse CLK1 to drive the first pumping circuit 131. Specifically, the first drive unit 134 may be enabled by the drive unit control circuit 136 to provide the first pumping circuit 131 with a first clock pulse CLK1.

The second drive unit 135 may provide a second clock pulse CLK2 to drive the first pumping circuit 131 and the second pumping circuit 132. Specifically, the second drive unit 135 may be enabled by the drive unit control circuit 136 to provide the first pumping circuit 131 and the second pumping circuit 132 with the second clock pulse CLK2.

The drive unit control circuit 136 may control the first drive unit 134 and the second drive unit 135 and control whether to enable the first pumping circuit 131 and the second pumping circuit 132. Specifically, when the voltage generating circuit 120 receives the read voltage generating signal from the control logic 110, the drive unit control circuit 136 may enable the first drive unit 134 and disable or not enable the second drive unit 135. When the first drive unit 134 is enabled, the first pumping circuit 131 may be enabled and the second pumping circuit 132 may be disabled or not enabled. Further, when the voltage generating circuit 120 receives the program voltage generating signal or the erase voltage generating signal from the control logic 110, the drive unit control circuit 136 may disable or not enable the first drive unit 134 and may enable the second drive unit 135. When the second drive unit 135 is enabled, both the first pumping circuit 131 and the second pumping circuit 132 may be enabled.

Referring to FIG. 5, the first pumping circuit 131 and the second pumping circuit 132 may include a plurality of pumping units PU. In some embodiments, each pumping unit PU may include a pumping capacitor and diode. The number of pumping units PU constituting the first pumping circuit 131 and the second pumping circuit 132 may be determined experimentally or according to performance requirements and may be different from that shown herein. In some embodiments, the first pumping circuit 131 and the second pumping circuit 132 may each include five pumping units PU. In other words, the first pumping circuit 131 and the second pumping circuit 132 may be made up of five pumping units PU according to effects checked through experiments, with the understanding that the present disclosure is not limited thereto.

The first clock pulse CLK1 may be provided so that each pumping unit PU of the first pumping circuit 131 may pump an input voltage $V_{IN}$ on the basis of the first clock pulse CLK1. The first clock pulse CLK1 may include a logical high value and a logical low value that are repeated periodically. The logical low value of the first clock pulse CLK1 may include a voltage of level "0", and the logical high value of the first clock pulse CLK1 may include a voltage of level "V1". According to some embodiments, the value of V1 may be changed according to settings or preferences (e.g., user settings). The first clock pulse CLK1 and a complementary pulse /CLK1 and the first clock pulse CLK1 may have a phase difference of 180 degrees from each other. In other words, when the first clock pulse CLK1 has a logic high level, the complementary pulse /CLK1 may have a logic low level, and when the complementary pulse /CLK1 has the logic high level, the first clock pulse CLK1 may have the logic low level.

The second clock pulse CLK2 is provided so that each pumping unit PU of the first pumping circuit 131 pumps the input voltage $V_{IN}$ on the basis of the first clock pulse CLK1. Further, the second clock pulse CLK2 is provided so that each pumping unit PU of the second pumping circuit 132 may pump the first pumping voltage VP1 received from the first pumping circuit 131 on the basis of the second clock pulse CLK2. The second clock pulse CLK2 may include a logical high value and a logical low value that are repeated periodically. For example, the logical low value of the second clock pulse CLK2 may include a voltage of level "0", and the logical high value of the second clock pulse CLK2 may include a voltage of level "V2". According to some embodiments, the value of V2 may be changed according to settings or preferences (e.g., user settings). The second clock pulse CLK2 and a complementary pulse /CLK2 of the second clock pulse CLK2 may have a phase difference of 180 degrees from each other.

In some embodiments, the logical high value of the second clock pulse CLK2 may be higher than the logical high value of the first clock pulse CLK1. That is, the voltage level of V2 which is the logical high value of the second clock pulse CLK2 may be higher than the voltage level of V1 which is the logical high value of the first clock pulse CLK1. In other words, V1 may be different from V2. Accordingly, when pumping the voltage of the same level, the level of the voltage pumped on the basis of the second clock pulse CLK2 may be higher than that of the voltage pumped on the basis of the first clock pulse CLK1.

The pumping circuit control unit 133 may include a first switch SW1 and a second switch SW2. In some embodiments, when the pumping circuit control unit 133 receives a first switching signal SW_ctr11 from the control logic 110, it may turn the first switch SW1 on and turn the second switch SW2 off. Accordingly, the pumping circuit control unit 133 may control the first pumping voltage VP1 output from the first pumping circuit 131 to be output to the outside of the charge pump circuit 130. For example, the pumping circuit control unit 133 may control the charge pump circuit 130 to output the first pumping voltage VP1 to the memory cell array.

In some embodiments, when receiving the second switching signal SW_ctr12 from the control logic 110, the pumping circuit control unit 133 may turn the first switch SW1 off, and turn the second switch SW2 on. That is, the pumping circuit control unit 133 may connect the first pumping circuit 131 and the second pumping circuit 132 in series, and may control the first pumping voltage VP1 output from the first pumping circuit 131 to be an input voltage of the second pumping circuit 132. Accordingly, the pumping circuit control unit 133 may the control the operation of the charge pump circuit 130 such that the first pumping voltage VP1 is not output to the outside of the charge pump circuit 130.

In some embodiments, when receiving a third switching signal SW_ctr13 from the control logic 110, the pumping circuit control unit 133 may turn both the first switch SW1 and the second switch SW2 on. Accordingly, the pumping circuit control unit 133 may control the first pumping voltage VP1 output from the first pumping circuit 131 to be output to the outside of the charge pump circuit 130. For example, the pumping circuit control unit 133 may control the charge pump circuit 130 to output the first pumping voltage VP1 to the memory cell array 160. Further, the pumping circuit control unit 133 may connect the first pumping circuit 131 and the second pumping circuit 132 in series, and may control the first pumping voltage VP1 output from the first pumping circuit 131 to be an input voltage of the second pumping circuit 132.

Figure 6:
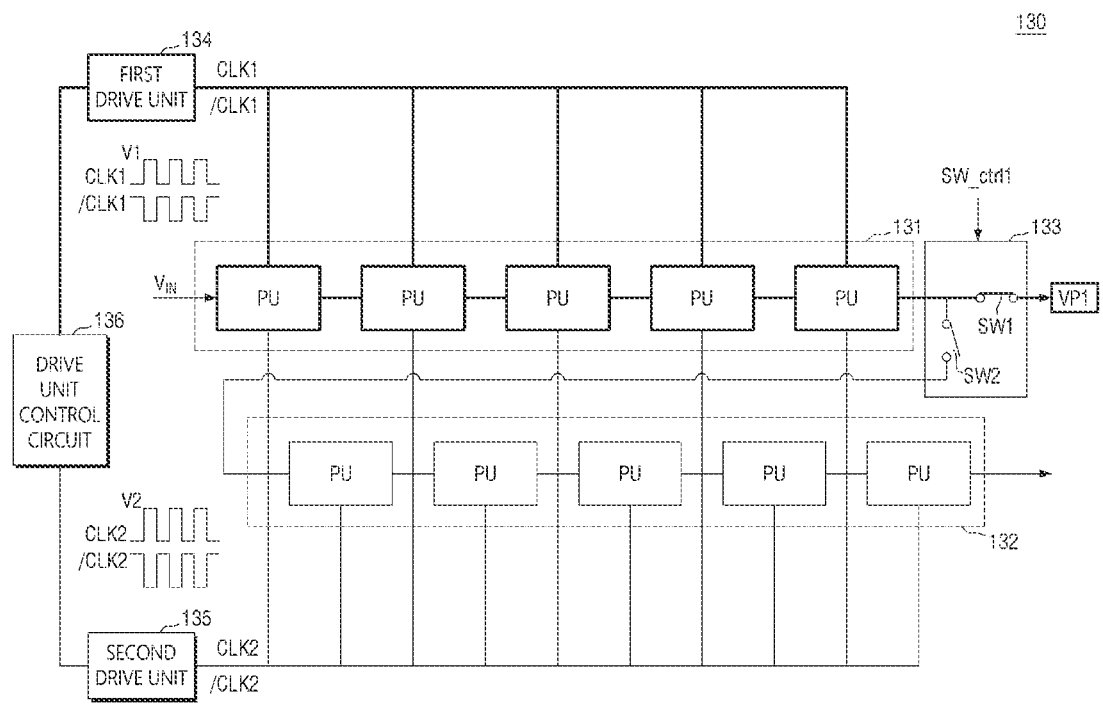
FIGS. 6 and 7 are diagrams for explaining the operation of the charge pump circuit of FIG. 5 according to some embodiments.
Figure 7:
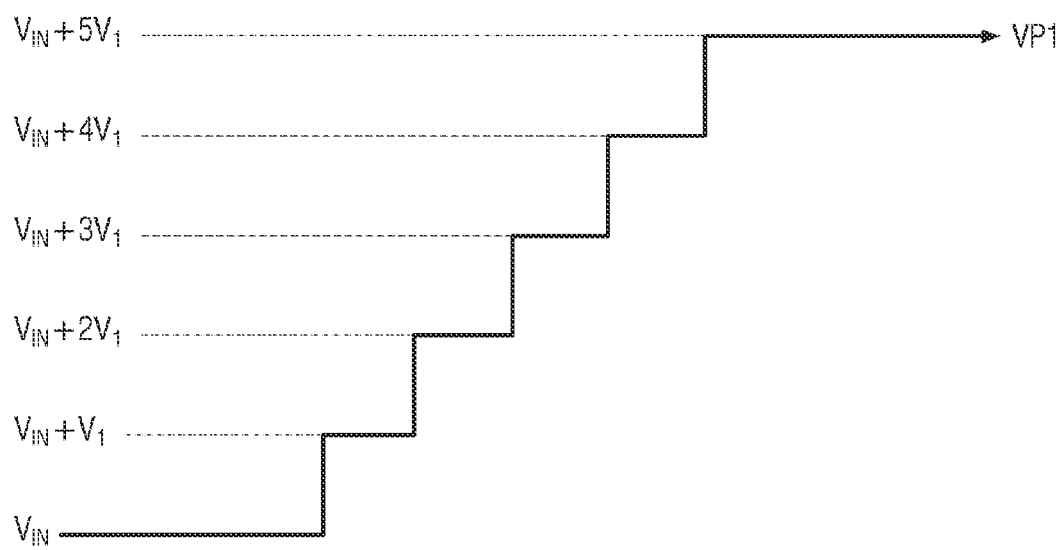

FIGS. 6 and 7 are diagrams for explaining the operation of the charge pump circuit of FIG. 5 according to some embodiments.

Referring to FIG. 6, when the control logic 110 transmits the voltage control signal CTRL_VOL to the voltage generating circuit 120 in response to the first command CMD1, the drive unit control circuit 136 may enable the first drive unit 134 and disable or not enable the second drive unit 135. In response to this, the first drive unit 134 may provide a first clock pulse CLK1 to each pumping unit PU of the first pumping circuit 131. Accordingly, the first pumping circuit 131 may pump the input voltage $V_{IN}$ by the magnitude of the first clock pulse CLK1 through each pumping unit PU of the first pumping circuit 131, and may output the first pumping voltage VP1.

When the control logic 110 transmits the first switching signal SW_ctr11 to the pumping circuit control unit 133 in response to the first command CMD1, the pumping circuit control unit 133 may turn the first switch SW1 on and may turn the second switch SW2 off in response to the first switching signal SW_ctr11. When the first switch SW1 is turned on, the first pumping voltage VP1 which is output by pumping the input voltage $V_{IN}$ through the first pumping circuit 131 may be output to the outside of the charge pump circuit 130. That is, the charge pump circuit 130 may output the first pumping voltage VP1, which is output from the first pumping circuit 131, to the memory cell array.

In some embodiments, the first command CMD1 may include a read command. In some embodiments, the voltage control signal CTRL_VOL may include a read voltage generating signal. Also, in some embodiments, the first pumping voltage VP1 may include the read voltage provided to the word line WL of the memory cell array 160.

Referring to FIG. 7, the input voltage $V_{IN}$ may increase by V1 which is the magnitude of the first clock pulse CLK1 through each pumping unit PU, and may be output as the first pumping voltage VP1. In some embodiments, because the first pumping circuit 131 may include five pumping units PU, the first pumping voltage VP1 output from the first pumping circuit 131 may be ($V_{IN}$+5V1) in which the input voltage $V_{IN}$ is pumped by 5V1 through the five pumping units PU.

Figure 8:
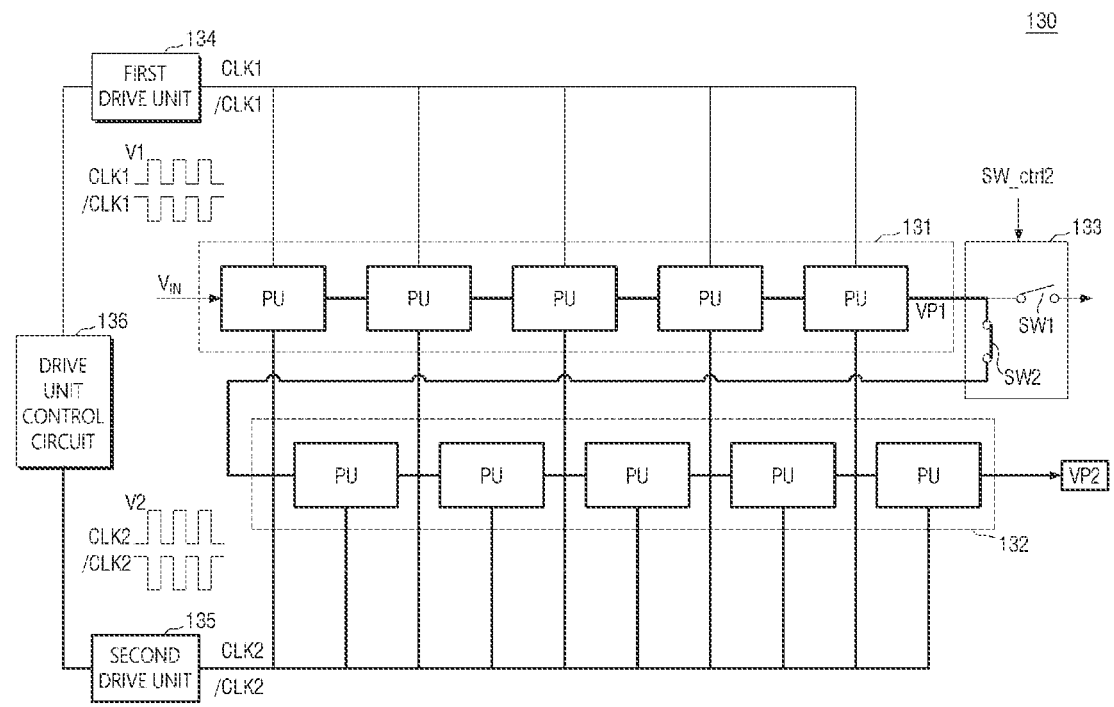
FIGS. 8 and 9 are diagrams for explaining the operation of the charge pump circuit of FIG. 5 according to some embodiments.
Figure 9:
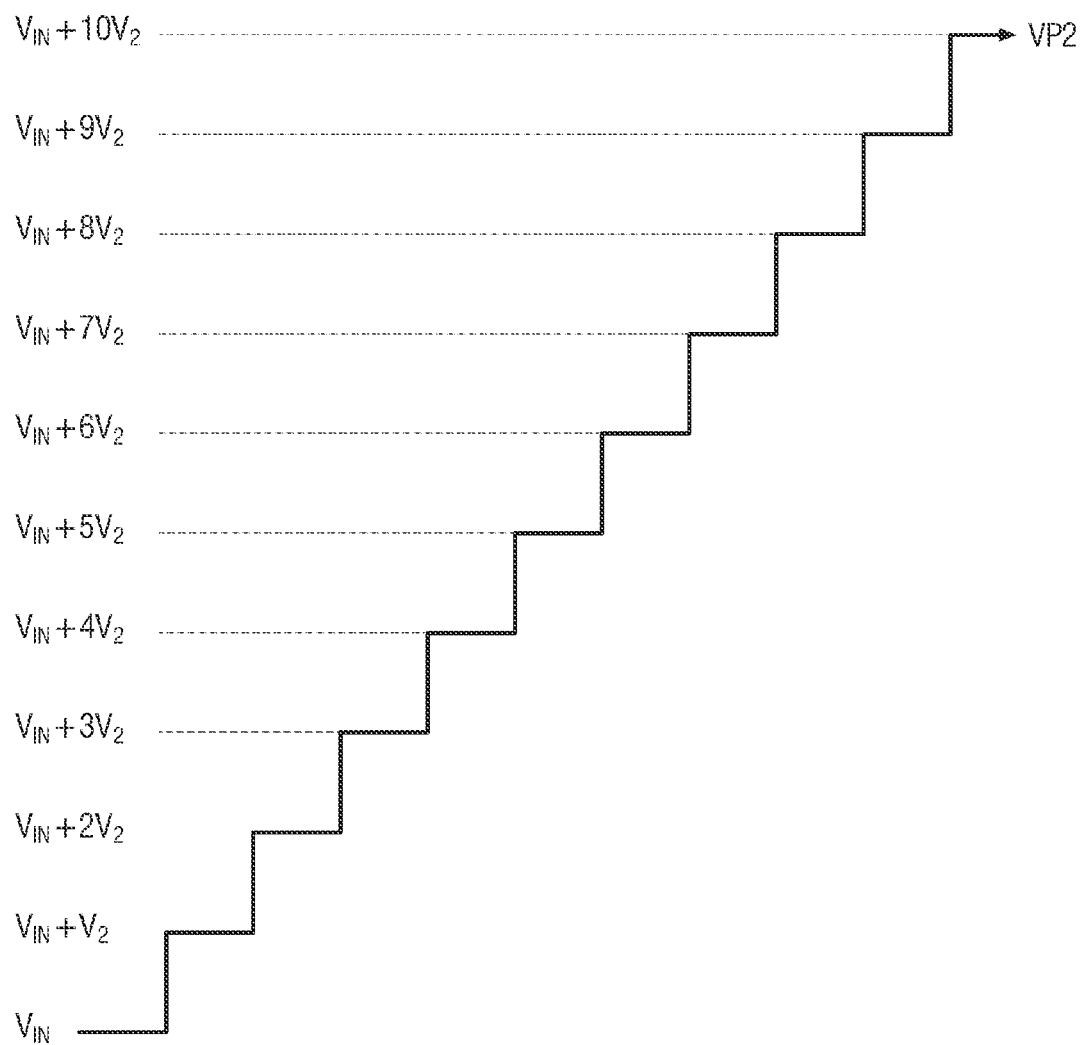

FIGS. 8 and 9 are diagrams for explaining the operation of the charge pump circuit of FIG. 5 according to some embodiments.

Referring to FIG. 8, when the control logic 110 transmits a voltage control signal CTRL_VOL to the voltage generating circuit 120 in response to the second command CMD2, the drive unit control circuit 136 may disable or not enable the first drive unit 134 and enable the second drive unit 135. In response to this, the second drive unit 135 may provide the second clock pulse CLK2 to each pumping unit PU of the first pumping circuit 131 and to each pumping unit PU of the second pumping circuit 132. Accordingly, the first pumping circuit 131 may pump the input voltage $V_{IN}$ by the magnitude of the second clock pulse CLK2 through each pumping unit PU of the first pumping circuit 131, and may output the first pumping voltage VP1. Further, the second pumping circuit 132 may pump the first pumping voltage VP1 received from the first pumping circuit 131 by the magnitude of the second clock pulse CLK2 through each pumping unit PU of the second pumping circuit 132, and may output the second pumping voltage VP2.

When the control logic 110 transmits the second switching signal SW_ctr12 to the pumping circuit control unit 133 in response to the second command CMD2, the pumping circuit control unit 133 may turn the first switch SW1 off and turn the second switch SW2 on, in response to the second switching signal SW_ctr12. When the first switch SW1 is turned off, the first pumping voltage VP1 which is output by pumping the input voltage $V_{IN}$ through the first pumping circuit 131 may not be output to the outside of the charge pump circuit 130. Further, when the second switch SW2 is turned on, the first pumping circuit 131 and the second pumping circuit 132 are connected in series. Accordingly, the first pumping voltage VP1 output from the first pumping circuit 131 may be input to the second pumping circuit 132. The second pumping circuit 132 may pump the first pumping voltage VP1 and output it as the second pumping voltage VP2. That is, the charge pump circuit 130 does not output the first pumping voltage VP1 output from the first pumping circuit 131 to the memory cell array, but may output the second pumping voltage VP2 output from the second pumping circuit 132 to the memory cell array.

In some embodiments, the second command CMD2 may include an erase command. In some embodiments, the voltage control signal CTRL_VOL may include an erase voltage generating signal. Also, in some embodiments, the second pumping voltage VP2 may include the erase voltage provided to the memory cell array 160.

Referring to FIG. 9, the input voltage $V_{IN}$ increases by V2 which is the magnitude of the second clock pulse CLK2 through each pumping unit PU of the first pumping circuit 131 and the second pumping circuit 132, and may be output as the second pumping voltage VP2. In some embodiments, the first pumping circuit 131 and the second pumping circuit 132 may each include five pumping units PU, and therefore, the first pumping voltage VP1 which may be output from the first pumping circuit 131 and input to the second pumping circuit 132 may be ($V_{IN}$+5V2) in which the input voltage $V_{IN}$ is pumped by 5V2 through the five pumping units PU. The second pumping voltage VP2 output from the second pumping circuit 132 may be ($V_{IN}$+10V2) in which the first pumping voltage VP1 of the magnitude ($V_{IN}$+5V2) is pumped by 5V2 through the five pumping units PU.

Figure 10:
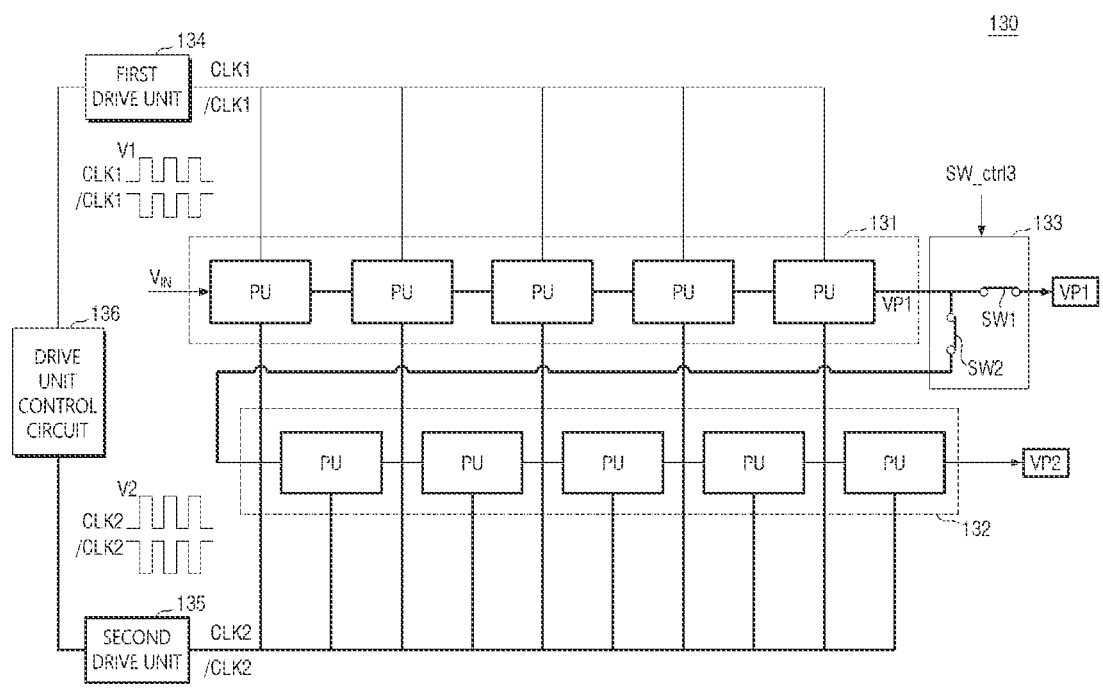
FIGS. 10 and 11 are diagrams for explaining the operation of the charge pump circuit of FIG. 5 according to some embodiments.
Figure 11:
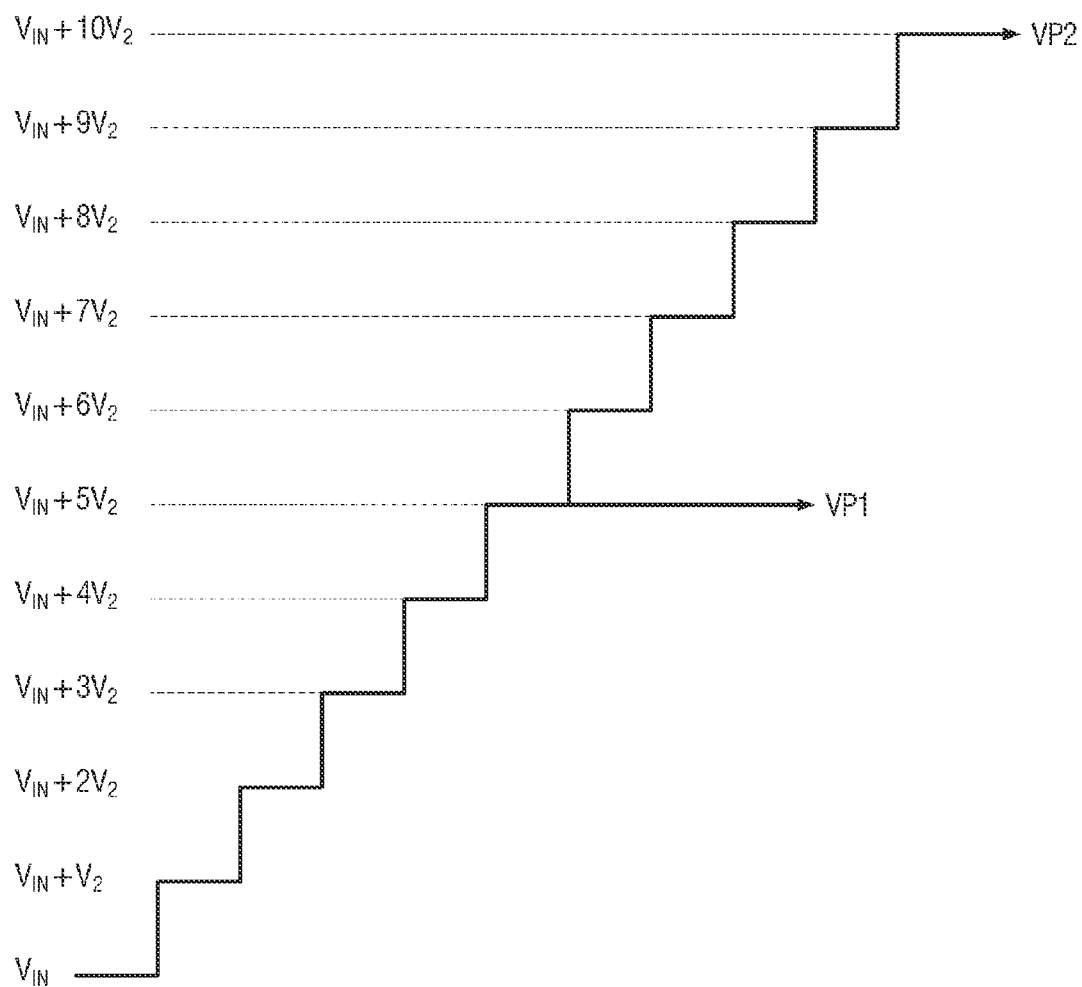

FIGS. 10 and 11 are diagrams for explaining the operation of the charge pump circuit of FIG. 5 according to some embodiments.

Referring to FIG. 10, when the control logic 110 transmits the voltage control signal CTRL_VOL to the voltage generating circuit 120 in response to the third command CMD3, the drive unit control circuit 136 may disable or not enable the first drive unit 134 and enable the second drive unit 135. In response to this, the second drive unit 135 may provide the second clock pulse CLK2 to each pumping unit PU of the first pumping circuit 131 and the second pumping circuit 132. Accordingly, the first pumping circuit 131 may pump the input voltage $V_{IN}$ by the magnitude of the second clock pulse CLK2 through each pumping unit PU of the first pumping circuit 131, and may output the first pumping voltage VP1. Further, the second pumping circuit 132 may pump the first pumping voltage VP1 received from the first pumping circuit 131 by the magnitude of the second clock pulse CLK2 through each pumping unit PU of the second pumping circuit 132, and may output the second pumping voltage VP2.

When the control logic 110 transmits a third switching signal SW_ctrl3 to the pumping circuit control unit 133 in response to the third command CMD3, the pumping circuit control unit 133 may turn both the first switch SW1 and the second switch SW2 on in response to the third switching signal SW_ctrl3. When the first switch SW1 is turned on, the first pumping voltage VP1 which is output by pumping the input voltage $V_{IN}$ through the first pumping circuit 131 may be output to the outside of the charge pump circuit 130. Further, when the second switch SW2 is turned on, the first pumping circuit 131 and the second pumping circuit 132 are connected in series. Accordingly, the first pumping voltage VP1 which is output from the first pumping circuit 131 may be input to the second pumping circuit 132. The second pumping circuit 132 may pump the first pumping voltage VP1 and output it as the second pumping voltage VP2. That is, the charge pump circuit 130 may output both the first pumping voltage VP1 output from the first pumping circuit 131 and the second pumping voltage VP2 output from the second pumping circuit 132.

In some embodiments, the third command CMD3 may include program commands. In some embodiments, the voltage control signal CTRL_VOL may include a program voltage generating signal. Also, in some embodiments, the second pumping voltage VP2 may include a program voltage provided to the word line WL of the memory cell array 160.

Referring to FIG. 11, the input voltage $V_{IN}$ increases by V2, which is the magnitude of the second clock pulse CLK2, through each pumping unit PU of the first pumping circuit 131, and may be output as the first pumping voltage VP1. Further, the first pumping voltage VP1 increases by V2, which is the magnitude of the second clock pulse CLK2, through each pumping unit PU of the second pumping circuit 132, and may be output as the second pumping voltage VP2. In some embodiments, since the first pumping circuit 131 and the second pumping circuit 132 may each include five pumping units PU, the first pumping voltage VP1 output from the first pumping circuit 131 may be ($V_{IN}$+5V2) in which the input voltage $V_{IN}$ is pumped by 5V2 through the five pumping units PU. Further, the second pumping voltage VP2 output from the second pumping circuit 132 may be ($V_{IN}$+10V2) in which the first pumping voltage VP1 of the magnitude ($V_{IN}$+5V2) output from the first pumping circuit 131 and input to the second pumping circuit 132 is pumped by 5V2 through the five pumping units PU.

Figure 12:
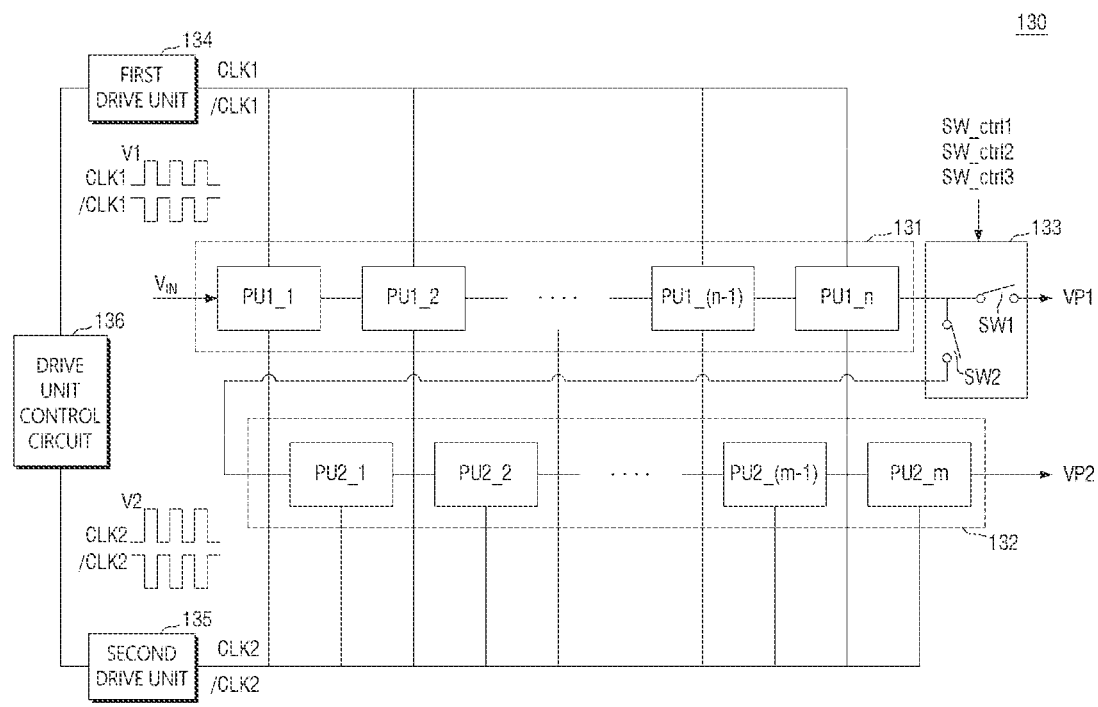
FIG. 12 is a diagram showing a charge pump circuit according to some embodiments.

FIG. 12 is a diagram showing a charge pump circuit according to some embodiments. For convenience of explanation, points different from those described referring to FIG. 5 will be mainly described.

Referring to FIG. 12, the first pumping circuit 131 and the second pumping circuit 132 may include a plurality of pumping units PU. In some embodiments, the first pumping circuit 131 may include n pumping units PU1_1, PU1_2, ..., PU1_n. Also, in some embodiments, the second pumping circuit 132 may include m pumping units PU2_1, PU2_2 ..., PU2_m. Herein, the variables 'n' and 'm' may refer to natural numbers.

In some embodiments, n and m may be the same. For example, the first pumping circuit 131 may include five pumping units PU, and the second pumping circuit 132 may also include five pumping units PU.

In some examples, n and m may be different from each other. For example, the first pumping circuit 131 may include five pumping units PU, and the second pumping circuit 132 may include ten pumping units PU.

Figure 13:
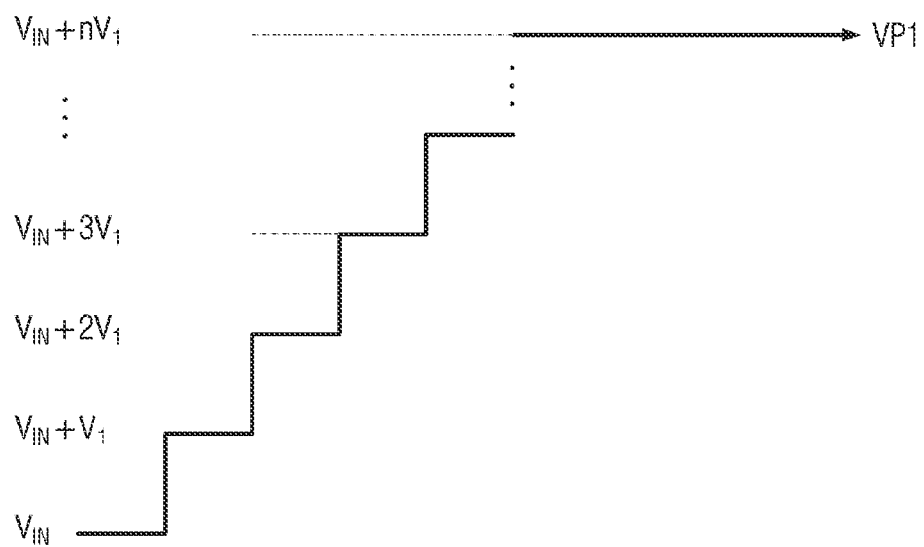
FIGS. 13 to 15 are diagrams for explaining the operation of the charge pump circuit according to some embodiments.
Figure 14:
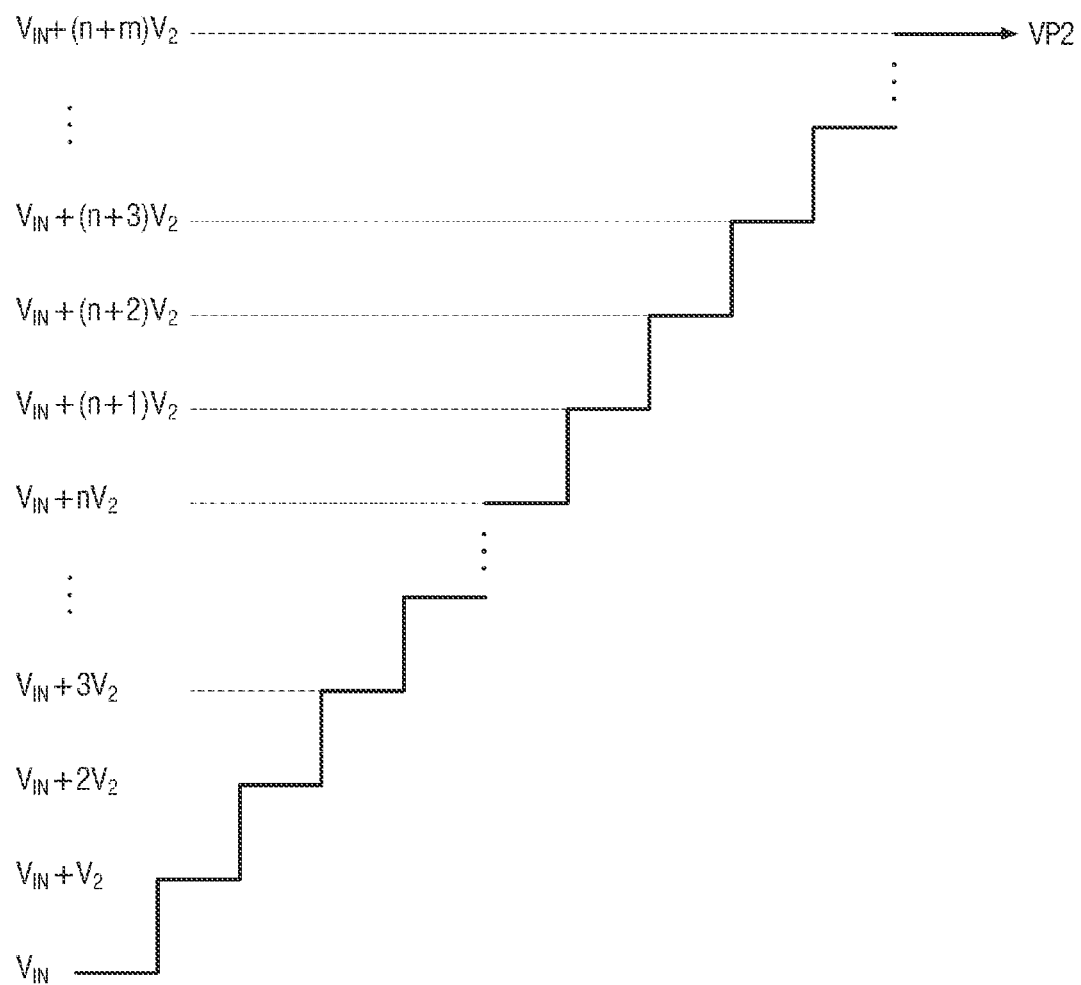
Figure 15:
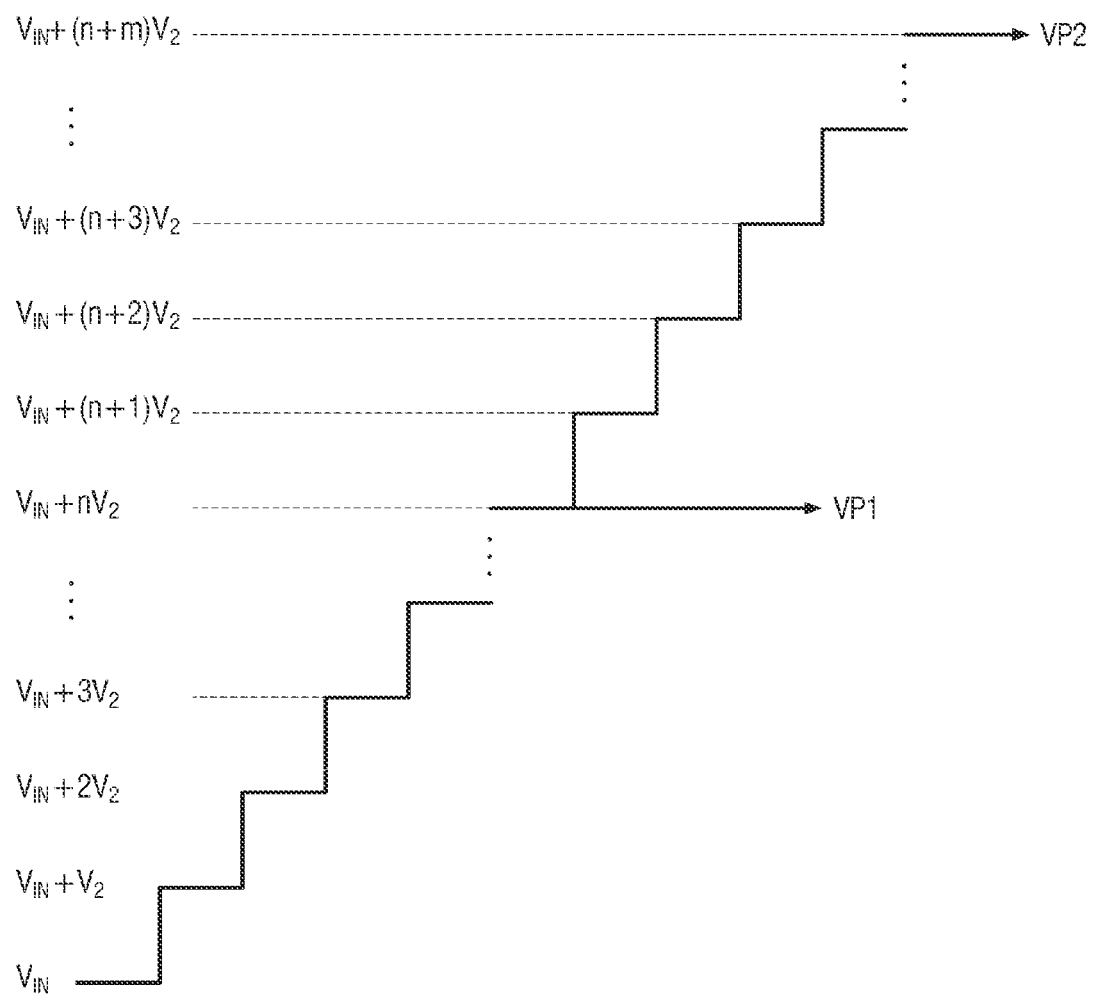

FIGS. 13 to 15 are diagrams for explaining the operation of the charge pump circuit according to some embodiments. For convenience of explanation, points different from those described referring to FIGS. 7, 9, and 11 will be mainly described.

Referring to FIG. 13, the input voltage $V_{IN}$ increases by V1 which is the magnitude of the first clock pulse CLK1 through each pumping unit PU, and may be output as the first pumping voltage VP1. In some embodiments, since the first pumping circuit 131 may include n pumping units PU, the first pumping voltage VP1 output from the first pumping circuit 131 may be ($V_{IN}$+nV1) in which the input voltage $V_{IN}$ is pumped by nV1 through n pumping units PU.

Referring to FIG. 14, the input voltage $V_{IN}$ may increse by V2, which is the magnitude of the second clock pulse CLK2 from each pumping unit PU, and may be output as the second pumping voltage VP2. In some embodiments, since the first pumping circuit 131 may include n pumping units PU and the second pumping circuit 132 may include m pumping units PU, the first pumping voltage VP1, which is output from the first pumping circuit 131 and input to the second pumping circuit 132, may be ($V_{IN}$+nV2) in which the input voltage $V_{IN}$ is pumped by nV2 through n pumping units PU. The second pumping voltage VP2 output from the second pumping circuit 132 may be a voltage of the magnitude ($V_{IN}$+(n+m)V2) in which the first pumping voltage VP1 of the magnitude ($V_{IN}$+nV2) received from the first pumping circuit 131 is pumped by mV2 through the m pumping units PU.

Referring to FIG. 15, the input voltage VIN may increase from each pumping unit PU by V2, which is the magnitude of the second clock pulse CLK2, and may be output as the first pumping voltage VP1 and the second pumping voltage VP2. In some embodiments, the first pumping circuit 131 may include n pumping units PU, and the second pumping circuit 132 may include m pumping units PU. Therefore, the first pumping voltage VP1 output from the first pumping circuit 131 may be ($V_{IN}$+nV2) in which the input voltage $V_{IN}$ is pumped by nV2 through n pumping units PU. Further, the second pumping voltage VP2 output from the second pumping circuit 132 may be ($V_{IN}$+(n+m)V2) in which the first pumping voltage VP1 of the magnitude ($V_{IN}$+nV2) received from the first pumping circuit 131 is pumped by mV2 through the m pumping units PU.

Figure 16:
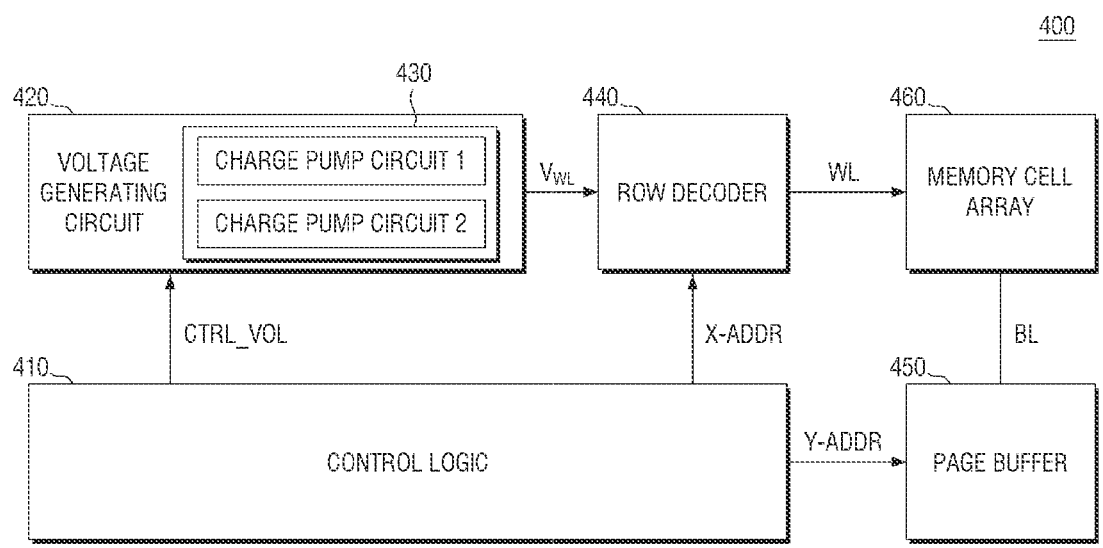
FIG. 16 is a diagram showing a non-volatile memory device according to a comparative embodiment.

FIG. 16 is a diagram showing a non-volatile memory device according to the comparative embodiment. The non-volatile memory device according to the comparative embodiment is a non-volatile memory device that is different from the above-described embodiments of the present inventive concepts.

Referring to FIG. 16, a non-volatile memory device 400 according to the comparative embodiment may include a charge pump circuit 430 which is made up of a first charge pump circuit and a second charge pump circuit.

Figure 17:
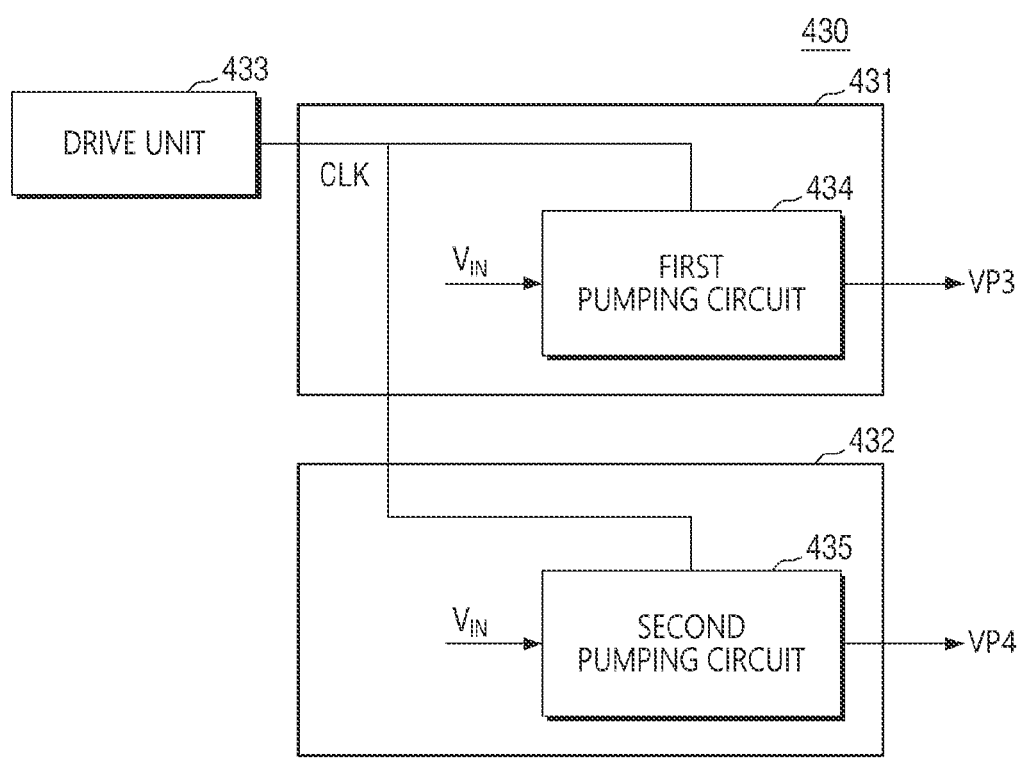
FIGS. 17 and 18 are diagrams showing the charge pump circuit of FIG. 16 according to the comparative embodiment.
Figure 18:
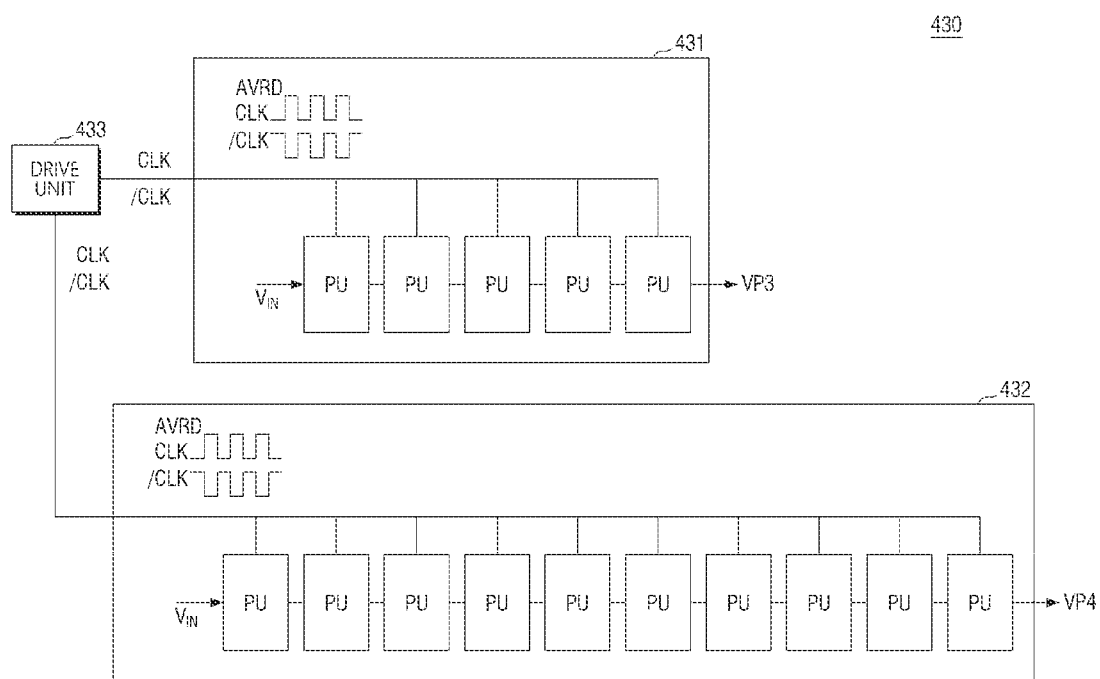

FIGS. 17 and 18 are diagrams showing the charge pump circuit of FIG. 16 according to the comparative embodiment. Again, the charge pump circuit according to the comparative embodiment is a charge pump circuit that is different from the charge pump circuit according to the embodiments of the present inventive concepts described above.

Referring to FIG. 17, a first charge pump circuit 431 may include a first pumping circuit 434. The first charge pump circuit 431 may pump the input voltage $V_{IN}$ through the first pumping circuit 434 and output it as a third pumping voltage VP3.

The second charge pump circuit 432 may include a second pumping circuit 435. The second charge pump circuit 432 may pump the input voltage $V_{IN}$ through the second pumping circuit 435 and output it as a fourth pumping voltage VP4.

A drive unit 433 may provide a clock pulse CLK to drive the first pumping circuit 434 and the second pumping circuit 435. Specifically, the drive unit 433 provides the same clock pulse CLK to the first pumping circuit 434 and the second pumping circuit 435, and may drive each of the first pumping circuit 434 and the second pumping circuit 435 to pump the input voltage $V_{IN}$.

Referring to FIG. 18, the first pumping circuit 434 and the second pumping circuit 435 may include a plurality of pumping units PU. In some embodiments, the second pumping circuit 435 may include a greater number of pumping units PU than the first pumping circuit 434. Accordingly, even when the clock pulse CLK provided to the first pumping circuit 434 and the second pumping circuit 435 is the same as the input voltage $V_{IN}$ of the first pumping circuit 434 and the second pumping circuit 435, the level of the fourth pumping voltage VP4 output from the second pumping circuit 435 may be higher than that of the third pumping voltage VP3 output from the first pumping circuit 434. That is, the non-volatile memory device 400 according to the comparative embodiment includes a plurality of charge pump circuits in which the number of pumping units PU is different to generate a plurality of voltages having different levels.

Referring to FIG. 5 in comparison to FIG. 18, the non-volatile memory device 100 according to some embodiments may output a plurality of voltages having different levels from one charge pump circuit 130. Therefore, the non-volatile memory device 100 according to some embodiments may include a smaller total number of charge pump circuits than the non-volatile memory device 400 according to the comparative embodiment. In some embodiments, the non-volatile memory device 100 that includes a smaller number of charge pump circuits may be smaller in size than the non-volatile memory device 400 according to the comparative embodiment.

The non-volatile memory device 100 according to some embodiments may provide the charge pump circuit 130 with a clock pulse having different levels to output voltage of different levels for each operation of the non-volatile memory device 100. The non-volatile memory device 100 according to some embodiments may selectively provide the clock pulses of different levels to the charge pump circuit 130 to output voltage of various levels, depending on the level of voltage to be output. Accordingly, the non-volatile memory device 100 according to some embodiments may provide selectively the charge pump circuit 130 with the clock pulses of different levels, in contrast to the non-volatile memory device 400 according to the comparative embodiment.

In the non-volatile memory device 100 according to some embodiments, the charge pump circuit 130 is divided into the first pumping circuit 131 and the second pumping circuit 132, and the first pumping circuit 131 and the second pumping circuit 132 may be partially or entirely enabled for each operation. Accordingly, the non-volatile memory device 100 according to some embodiments may generate a voltage efficiently or more efficiently.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A non-volatile memory device comprising:
a memory cell array;
a first pumping circuit configured to output a first pumping voltage;
a second pumping circuit configured to pump the first pumping voltage of the first pumping circuit and output a second pumping voltage; and
a pumping circuit control unit which is connected to the first pumping circuit and the second pumping circuit and configured to cause at least one of the first pumping voltage and the second pumping voltage to be output to the memory cell array,
wherein the first pumping circuit is enabled in a first mode, in a second mode different from the first mode, and in a third mode different from the first and second modes,
wherein the second pumping circuit is not enabled in the first mode, enabled in the second mode, and enabled in the third mode,
wherein in the first mode, the pumping circuit control unit is configured to select and output only the first pumping voltage to the memory cell array,
wherein in the second mode, the pumping circuit control unit is configured to select and output only the second pumping voltage to the memory cell array, and
wherein in the third mode, the pumping circuit control unit is configured to output both the first pumping voltage and the second pumping voltage separately to the memory cell array.

2. The non-volatile memory device of claim 1, wherein the first mode includes a read mode in which the first pumping voltage is applied to a word line of the memory cell array as a read voltage used to read a memory cell of the memory cell array, and wherein the second mode includes an erase mode in which the second pumping voltage is applied to the memory cell array as an erase voltage, used to erase a memory cell of the memory cell array.

3. The non-volatile memory device of claim 1, wherein the pumping circuit control unit includes a first switch configured to output selectively the first pumping voltage to the memory cell array, and a second switch configured to connect selectively the first pumping circuit with the second pumping circuit,
   wherein in the first mode, the pumping circuit control unit is configured to turn the first switch on to output the first pumping voltage to the memory cell array, and configured to turn the second switch off to release a connection between the first pumping circuit and the second pumping circuit, and
   wherein in the second mode, the pumping circuit control unit is configured to turn the first switch off to disable supply of the first pumping voltage to the memory cell array, and configured to turn the second switch on to connect the first pumping circuit and the second pumping circuit and output the second pumping voltage to the memory cell array.

4. The non-volatile memory device of claim 1, wherein the first mode includes a read mode in which the first pumping voltage is applied to a word line of the memory cell array as a read voltage used to read a memory cell of the memory cell array,
   wherein the second mode includes an erase mode in which the second pumping voltage is applied to the memory cell array as an erase voltage used to erase a memory cell of the memory cell array, and
   wherein the third mode includes a program mode in which the second pumping voltage is applied to a word line of the memory cell array as a program voltage used to program a memory cell of the memory cell array.

5. The non-volatile memory device of claim 1, wherein the pumping circuit control unit includes a first switch configured to output selectively the first pumping voltage to the memory cell array, and a second switch configured to connect selectively the first pumping circuit with the second pumping circuit,
   in the first mode, the pumping circuit control unit is configured to turn the first switch on to output the first pumping voltage to the memory cell array, and configured to turn the second switch off to release connection between the first pumping circuit and the second pumping circuit,
   in the second mode, the pumping circuit control unit is configured to turn the first switch off to not output the first pumping voltage to the memory cell array, and configured to turn the second switch on to connect the first pumping circuit with the second pumping circuit and output the second pumping voltage to the memory cell array, and
   in the third mode, the pumping circuit control unit is configured to turn the first switch on to output the first pumping voltage to the memory cell array, and is configured to turn the second switch on to connect the first pumping circuit with the second pumping circuit and output the second pumping voltage to the memory cell array.

6. The non-volatile memory device of claim 1, wherein the first pumping circuit includes n first pumping units,
   wherein the second pumping circuit includes m second pumping units, and
   wherein n and m are natural numbers equal to each other.

7. The non-volatile memory device of claim 6, wherein n and m are equal to five.

8. The non-volatile memory device of claim 1, wherein the first pumping circuit includes n first pumping units,
   wherein the second pumping circuit includes m second pumping units, and
   wherein n and m are natural numbers different from each other.

9. The non-volatile memory device of claim 1, further comprising:
   a first drive unit configured to provide a first clock pulse to only the first pumping circuit and not provide the first clock pulse to the second pumping circuit; and
   a second drive unit configured to provide both the first pumping circuit and the second pumping circuit with a second clock pulse having a voltage level higher than the first clock pulse.

10. The non-volatile memory device of claim 9, further comprising:
    a drive unit control circuit configured to control the first drive unit and the second drive unit, and thereby control whether the second pumping circuit is enabled or not enabled.

11. The non-volatile memory device of claim 10, wherein the drive unit control circuit is configured to enable the first drive unit, and thereby enable the first pumping circuit and not enable the second pumping circuit, and
    wherein the drive unit control circuit is configured to enable the second drive unit, and thereby enable both the first pumping circuit and the second pumping circuit.

12. A non-volatile memory device comprising:
    a memory cell array;
    a voltage generating circuit configured to provide a voltage to the memory cell array; and
    a control logic configured to control the voltage generating circuit,
    wherein the voltage generating circuit includes:
      a pumping circuit which includes a plurality of pumping units connected in series with each other, and
      a pumping circuit control unit configured to receive an output of the plurality of pumping units and outputs the output to the memory cell array,
    wherein the pumping circuit control unit is configured to output a first pumping voltage generated from the plurality of pumping units to the memory cell array in response to the control logic receiving a first command,
    wherein the pumping circuit control unit is configured to output a second pumping voltage higher than the first pumping voltage generated from the plurality of pumping units to the memory cell array in response to the control logic receiving a second command different from the first command, and
    wherein the pumping circuit control unit is configured to output both the first pumping voltage and the second pumping voltage separately to the memory cell array in response to the control logic receiving a third command different from the first and second commands.

13. The non-volatile memory device of claim 12, wherein the first command includes a read command configured to instruct an application of the first pumping voltage as a read voltage to a word line of the memory cell array,
    the second command includes an erase command configured to instruct an application of the second pumping voltage as an erase voltage to erase a memory cell of the memory cell array, the third command includes a program command configured to instruct application of the second pumping voltage as a program voltage to a word line of the memory cell array.

14. The non-volatile memory device of claim 12, wherein the control logic enables a first subset pumping units of the plurality of pumping units, and disables remaining pumping units of the plurality of pumping units in response to the first command, and wherein the control logic enables all of the plurality of pumping units in response to the second command and the third command.

15. The non-volatile memory device of claim 12, wherein the voltage generating circuit further includes:
a first drive unit configured to provide a first clock pulse to the pumping circuit; and
a second drive unit configured to provide the pumping circuit with a second clock pulse having a higher voltage level than the first clock pulse,
wherein the control logic is configured to enable the first drive unit and not enable the second drive unit, in response to the first command, and
wherein the control logic is configured to enable the second drive unit and not enable the first drive unit in response to the second command and the third command.

16. A non-volatile memory device comprising:
a memory cell array;
a first pumping circuit configured to output a first pumping voltage;
a second pumping circuit configured to pump the first pumping voltage of the first pumping circuit an output a second pumping voltage;
a first drive unit configured to provide a first clock pulse to only the first pumping circuit and not to the second pumping circuit;
a second drive unit configured to provide both the first and second pumping circuits with a second clock pulse having a higher voltage level than the first clock pulse; and
a pumping circuit control unit which is connected to the first pumping circuit and the second pumping circuit configured to output the first pumping voltage to the memory cell array in a first mode, the second pumping voltage to the memory cell array in a second mode, and the first pumping voltage and the second pumping voltage separately to the memory cell array in a third mode.

17. The non-volatile memory device of claim 16, wherein the first pumping circuit is enabled in a first mode, a second mode different from the first mode, and a third mode different from the first mode and the second mode,
the second pumping circuit is not enabled in the first mode and enabled in the second mode and the third mode.

18. The non-volatile memory device of claim 17, wherein the pumping circuit control unit includes a first switch configured to output selectively the first pumping voltage to the memory cell array, and a second switch configured to connect selectively the first pumping circuit with the second pumping circuit,
in the first mode, the pumping circuit control unit is configured to turn the first switch on to output the first pumping voltage to the memory cell array, and configured to turn the second switch off to release connection between the first pumping circuit and the second pumping circuit,
in the second mode, the pumping circuit control unit is configured to turn the first switch off to not output the first pumping voltage to the memory cell array, and configured to turn the second switch on to connect the first pumping circuit with the second pumping circuit and output the second pumping voltage to the memory cell array, and
in the third mode, the pumping circuit control unit is configured to turn the first switch on to output the first pumping voltage to the memory cell array, and configured to turn the second switch on to connect the first pumping circuit with the second pumping circuit and output the second pumping voltage to the memory cell array.

19. The non-volatile memory device of claim 17, wherein the first mode includes a read mode in which the first pumping voltage is applied as a read voltage to a word line of the memory cell array,
the second mode includes an erase mode in which the second pumping voltage is applied as an erase voltage to the memory cell array to erase a memory cell of the memory cell array, and
the third mode includes a program mode in which the second pumping voltage is applied as a program voltage to a word line of the memory cell array.

* * * * *